(12) United States Patent
Murthy et al.

(10) Patent No.: US 7,358,547 B2
(45) Date of Patent: Apr. 15, 2008

(54) SELECTIVE DEPOSITION TO IMPROVE SELECTIVITY AND STRUCTURES FORMED THEREBY

(75) Inventors: Anand Murthy, Portland, OR (US); Nayanee Gupta, Portland, OR (US); Chris Auth, Portland, OR (US); Glenn A. Glass, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 163 days.

(21) Appl. No.: 11/152,266

(22) Filed: Jun. 13, 2005

(65) Prior Publication Data

US 2005/0230760 A1 Oct. 20, 2005

Related U.S. Application Data

(62) Division of application No. 10/744,195, filed on Dec. 22, 2003, now Pat. No. 7,129,139.

(51) Int. Cl.
| | |
|---|---|
| *H01L 27/10* | (2006.01) |
| *H01L 29/76* | (2006.01) |
| *H01L 29/94* | (2006.01) |
| *H01L 31/062* | (2006.01) |
| *H01L 31/113* | (2006.01) |
| *H01L 31/119* | (2006.01) |
| *H01L 29/00* | (2006.01) |

(52) U.S. Cl. ......... 257/202; 257/368; 257/506
(58) Field of Classification Search ........ 257/202–211, 257/368–374, 506–510
See application file for complete search history.

(56) References Cited

U.S. PATENT DOCUMENTS

| 5,569,624 | A | * | 10/1996 | Weiner | 438/285 |
|---|---|---|---|---|---|
| 6,020,616 | A | * | 2/2000 | Bothra et al. | 257/207 |
| 6,235,568 | B1 | | 5/2001 | Murthy et al. | |
| 6,403,482 | B1 | | 6/2002 | Rovedo et al. | |
| 6,777,759 | B1 | | 8/2004 | Chau et al. | |
| 7,109,568 | B2 | * | 9/2006 | Kumagai et al. | 257/627 |
| 2002/0190284 | A1 | | 12/2002 | Murthy et al. | |
| 2003/0098479 | A1 | | 5/2003 | Murthy et al. | |
| 2005/0093021 | A1 | | 5/2005 | Ouyang et al. | |

\* cited by examiner

*Primary Examiner*—Cuong Nguyen
(74) *Attorney, Agent, or Firm*—Kathy Ortiz

(57) ABSTRACT

Methods and associated apparatus of forming a microelectronic structure are described. Those methods comprise providing a substrate comprising a region of higher active area density comprising source and drain recesses and a region of lower active area density comprising source and drain recesses, wherein the region of lower active area density further comprises dummy recesses, and selectively depositing a silicon alloy layer in the source, drain and dummy recesses to enhance the selectivity and uniformity of the silicon alloy deposition.

4 Claims, 10 Drawing Sheets

SELECTIVE DEPOSITION TO IMPROVE SELECTIVITY AND STRUCTURES FORMED THEREBY

This U.S. patent application is a divisional of U.S. patent application Ser. No. 10/744,195 filed Dec. 22, 2003, now U.S. Pat. No. 7,129,139.

FIELD OF THE INVENTION

The present invention relates to the field of microelectronic devices, and more particularly to methods of improving selectivity loss in silicon alloy films.

BACKGROUND OF THE INVENTION

Microelectronic devices are often manufactured in and on silicon wafers and on other types other substrates. Such integrated circuits may include millions of transistors, such as metal oxide semiconductor (MOS) field effect transistors, as are well known in the art. MOS transistors typically comprise source, gate, and drain regions. The source and the drain regions of the MOS transistor may comprise a silicon germanium alloy film, which may enhance the performance of a MOS transistor by introducing a strain into the crystal lattice of such a transistor. The strain introduced into the lattice can increase electron and hole mobility and thus the speed of a MOS transistor manufactured with source and drain regions comprising a silicon germanium alloy.

However, there are problems associated with the use of a silicon germanium alloy to fabricate the source and drain regions of a transistor. One problem that may be encountered is that during the deposition of a silicon germanium alloy film, the silicon germanium film may be deposited in an undesired area of a transistor. For example (referring to FIG. 3a), a substrate 300 (that preferably comprises silicon, and may comprise a transistor structure) may comprise a source region 310, a gate region 320 and a drain region 330. A silicon germanium layer 340 may be selectively deposited, for example, by epitaxial growth, as is known in the art, within the source region 310 and the drain region 330 (FIG. 3b).

The silicon germanium layer 340 may not grow, or deposit selectively i.e. the growth may not be confined to the exposed silicon areas (i.e., the source region 310 and the drain region 330) of the substrate 300. Some of the silicon germanium layer 310 may be deposited on a dielectric spacer structure 322 of the gate region 320, and/or on a dielectric isolation area 350 of the device, for example. Such an undesired growth of the silicon germanium layer 340 may result in poor performance or even inoperability of the device due to shorting of the device, etc.

Another problem encountered with the deposition of silicon germanium alloy films is that the thickness uniformity across a substrate may be different depending on the silicon density (i.e., the amount of exposed silicon area) in different parts of a device substrate, such as within a silicon die. For example, referring to FIG. 3c, a substrate 300 may comprise a region with a lower density of exposed silicon area 360, and a region with a higher density of exposed silicon area 370. During the growth of a silicon germanium layer, the region with the lower density of exposed silicon area 360 may exhibit a thicker film deposition than the region with the higher density of exposed silicon area 370. Referring to FIG. 3d, a first thickness 342 of the silicon germanium layer in the region of higher density of exposed silicon 370 may be significantly thinner than a second thickness 344 of the silicon germanium layer in the region of lower density of exposed silicon 360. Such uneven deposition of the silicon germanium layer across a substrate may result in poor yields, quality and reliability of the devices so fabricated across a substrate.

Therefore, it would be desirable to provide a method of selectively depositing a uniform silicon alloy film, such as a silicon germanium alloy film, for use in microelectronic device fabrication. The methods and structures of the present invention provide such a method.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
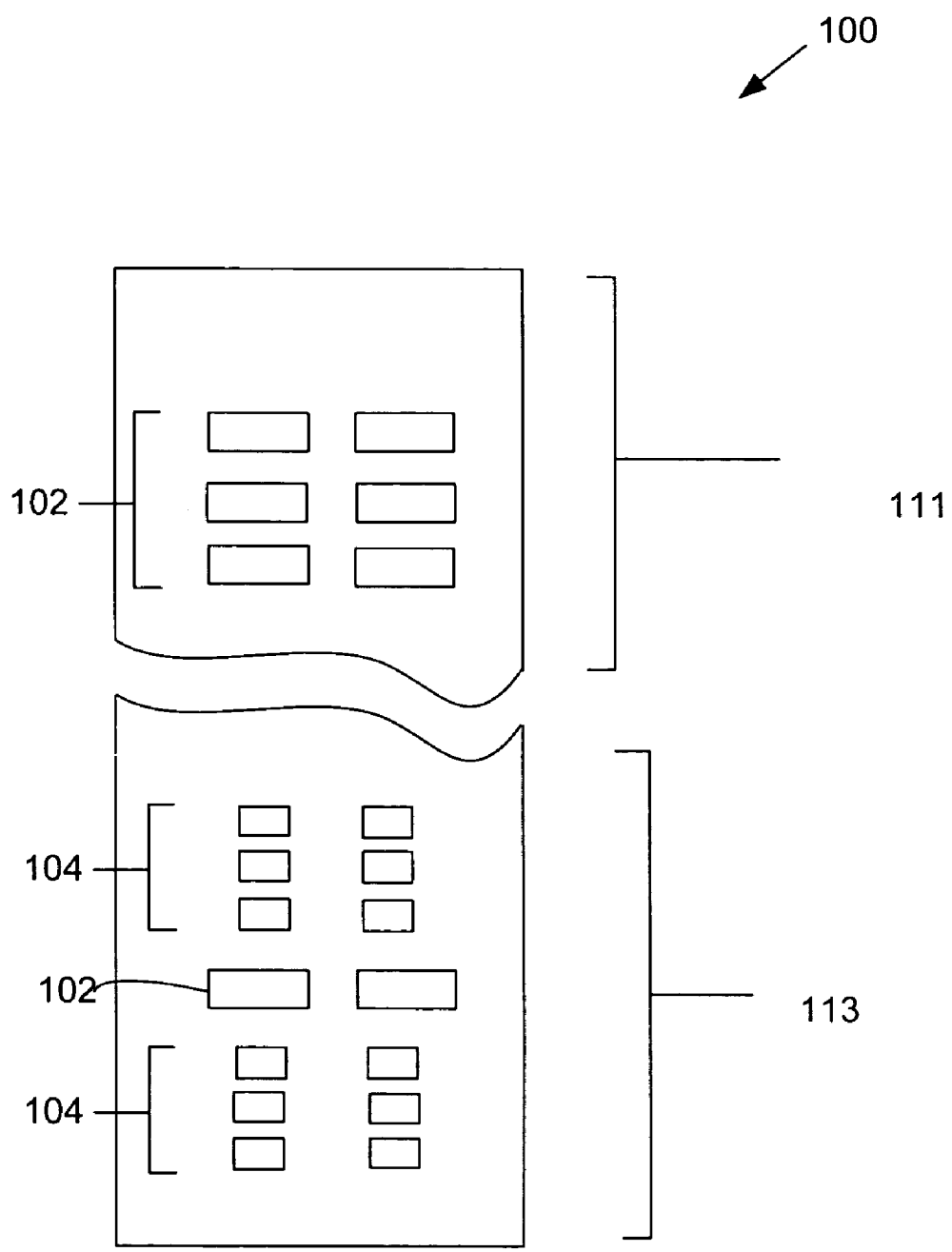
FIGS. 1a-1g represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic device are described. Those methods comprise providing a substrate comprising a region of higher active area density comprising source and drain recesses and a region of lower active area density comprising source and drain recesses, wherein the region of lower active area density further comprises dummy recesses, and then selectively depositing a silicon alloy layer in the source, drain and dummy recesses to enhance the selectivity and thickness uniformity of the silicon alloy deposition.

FIGS. 1a-1g illustrate an embodiment of a method and associated structures of improving the selectivity of a silicon alloy deposition according to the present invention. FIG. 1a illustrates top view of a portion of a substrate 100 that may preferably comprise a silicon substrate 100. The silicon substrate 100 may comprise a p-type dopant material, such as boron, although other types of dopant materials may be utilized, depending upon the particular application.

The substrate 100 may further comprise a plurality of active areas 102. The plurality of active areas 102 may comprise areas within the substrate 100 that may be intended to electrically function within the substrate 100. In the current embodiment, the plurality of active areas 102 may comprise silicon areas that are preferably doped with a p type material, such as boron. The substrate 100 may also comprise a plurality of non-active 104 areas. The plurality of non-active areas 104 may comprise areas within the substrate that are not intended to operate electrically within the substrate 100. In the current embodiment the plurality of non-active areas 104 may comprise dummy areas, or dummy features, that is, areas that are added to the substrate in order to improve the uniformity of a device, as is well known in the art. In the current embodiment, the plurality of non-active areas 104 may be added during a previous step, such as during an isolation step, as is well known in the art. The plurality of non-active areas 104 may comprise silicon.

The substrate 100 may comprise a region of higher active area density 111 and a region of lower active area density 113, which may be located in different parts of the substrate 100. For example, an area that contains many large transistors, such as an area of logic within a semiconductor device, may have a higher density of active areas 102, or exposed silicon, than an area that contains smaller transistors, such as a memory area, or field area, of a semiconductor die, as is known to those skilled in the art.

Figure 1B:
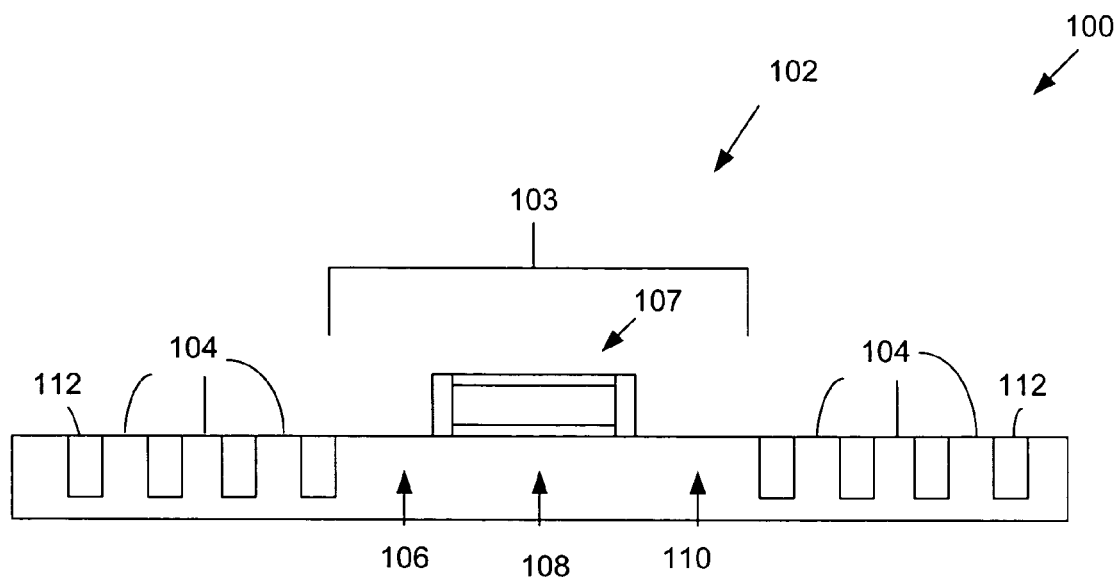

Referring to FIG. 1b, which represents a cross section of the region of lower active area density 113 of the substrate 100, the plurality of active areas 102 may further comprise a transistor region 103, as is well known in the art. The transistor region 103 may comprise a source region 106, a channel region 108 and a drain region 110. The transistor region 103 may further comprise a gate structure 107, as is known in the art. The substrate 100 may further comprise a plurality of isolation regions 112, which may comprise a shallow trench isolation as is well known in the art. The plurality of isolation regions 112 may function to electrically isolate the plurality of active areas 102 from the plurality of non-active areas 104.

Figure 1C:
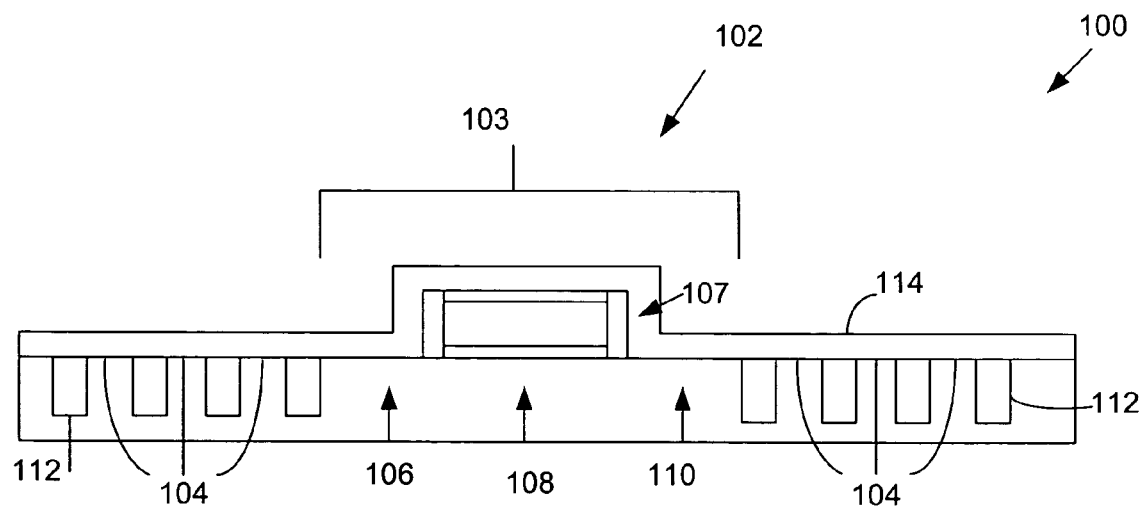

A masking layer 114 may be formed on the substrate 100 (FIG. 1c). The masking layer 114 may comprise a dielectric material, such as an oxide layer or a nitride layer, for example, but may comprise any suitable material that serves to mask the substrate 100 from a subsequent etching, or removal step. The masking material is preferably an oxide material, and may be deposited by a chemical vapor deposition method, for example, but may be deposited by other means well known in the art.

Figure 1D:
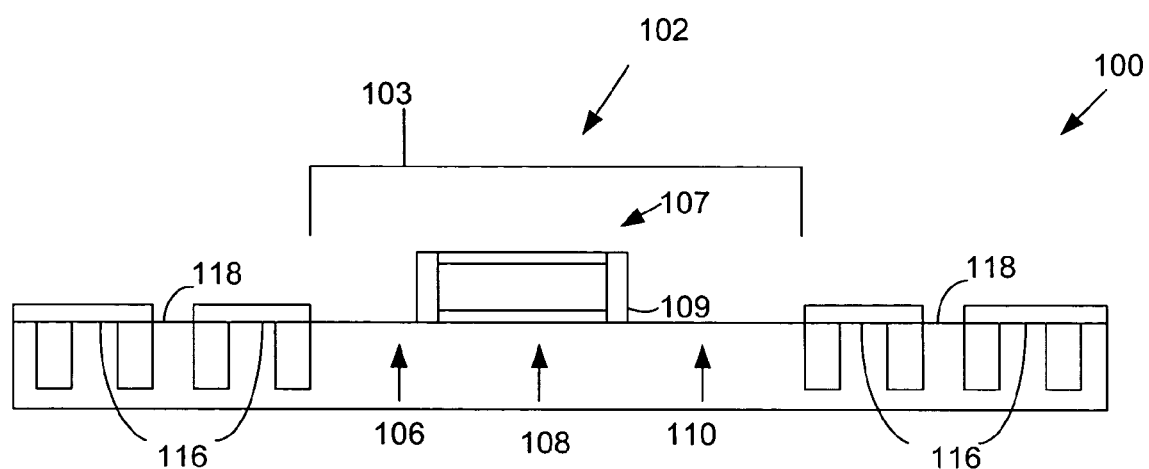
Figure 1E:
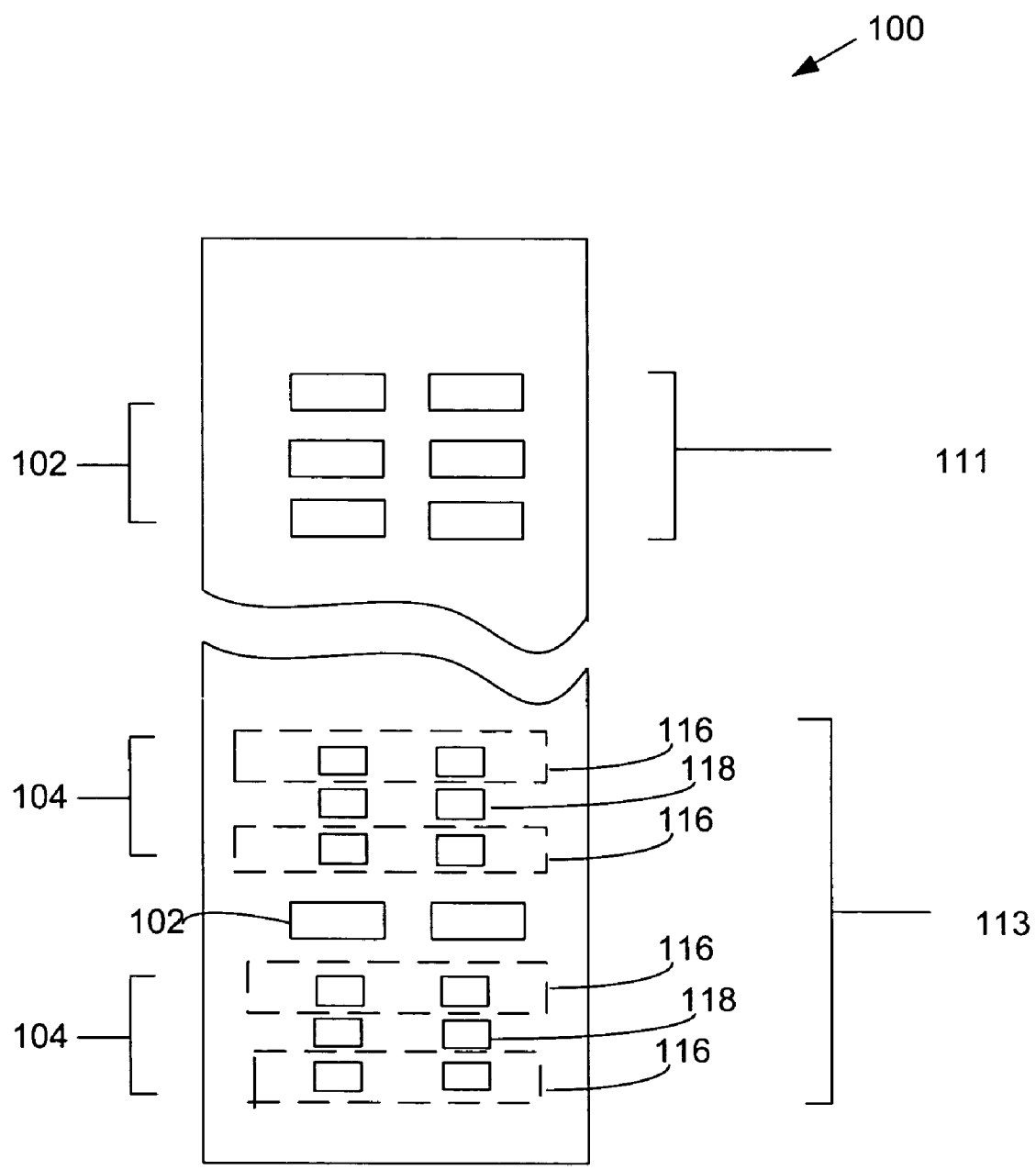

The masking layer 114 may then be patterned and etched using methods well known in the art to expose portions of the plurality of non-active areas 118 (i.e. dummy features) and to expose portions of the plurality of active areas 102, such as the source region 106 and the drain region 110 of the transistor region 103 (FIGS. 1d and 1e). The portion of masked non-active area 116 is chosen so that the amount of exposed silicon density in the region of lower active area density 113 is substantially the same as the amount of exposed silicon density in the region of higher active area density 111. In other words, the density of the unmasked non-active area portions 118 (i.e. the density of the exposed dummy features) adds additional exposed silicon density to the amount of exposed silicon density of the region of lower active area density 113, so that the amount of silicon density across the substrate 100 may be made to be substantially uniform.

For example, if the density of exposed (uncovered by the masking layer 114) active areas 102 (silicon) comprises about 10 percent in the region of higher active area density 111, and the density of exposed silicon in the region of lower active area density 113 is about 5 percent, then an amount of the non-active areas 104 will remain unmasked in the region of lower active areas density 113 that is sufficient to contribute an additional amount of exposed silicon density to the region of the lower active area density 113 so that the total amount of exposed silicon density (non-active areas 104 plus active areas 102) in the region of lower active area density 113 is about 10 percent.

Figure 1F:
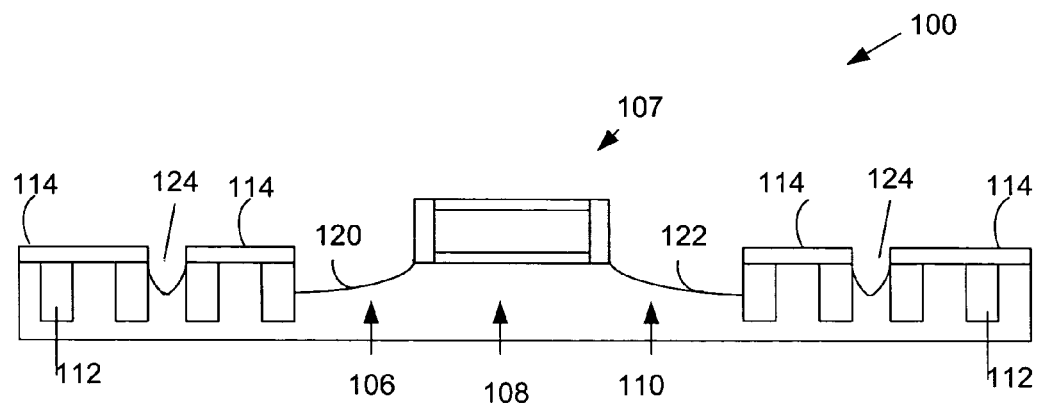

Once the source region 106, the drain region 110 and the unmasked non-active area portions 118 are exposed after patterning and etching the masking layer 114, a source recess 120, a drain recess 122 and a plurality of non-active area recesses 124 (corresponding to the unmasked non-active area portions 118) may be formed (FIG. 1f). It will be appreciated that the formation of the source recess 120, the drain recess 122 and the plurality of non-active area recesses 124 may be formed in the same process step. For example, a selective isotropic wet etch may be employed to form the aforementioned recesses that may comprises an aqueous solution of ammonium hydroxide in the concentration range of about 2 to about 10 percent by volume at about 20° C.

Figure 1G:
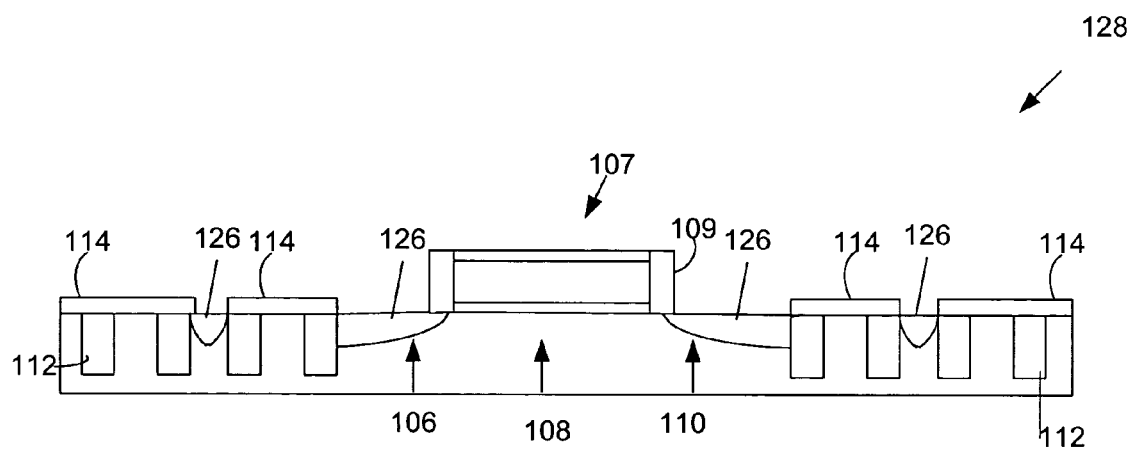

After the source recess 120, the drain recess 122 and the plurality of non-active area recesses 124 are formed, a silicon alloy layer 126 may be selectively formed within the source recess 120, the drain recess 122 and the plurality of non-active area recesses 124 (FIG. 1g). The silicon alloy layer 126 may be formed by utilizing an epitaxial deposition method, as is known in the art. In one embodiment, the silicon alloy layer 126 may preferably comprise a p-type (for example boron) doped silicon germanium alloy that comprises a germanium concentration of up to about 30 percent, for example. In one embodiment, the silicon alloy deposition process may comprise a gas mixture including dichlorosilane, silane and/or disilane, hydrogen, anhydrous hydrochloric acid and/or chlorine gas, diborane, germanium and/or digermane. The temperature may be between about 550 to about 800° C., and the pressure may range from about 5 Torr to about atmospheric pressure.

Figure 3A:
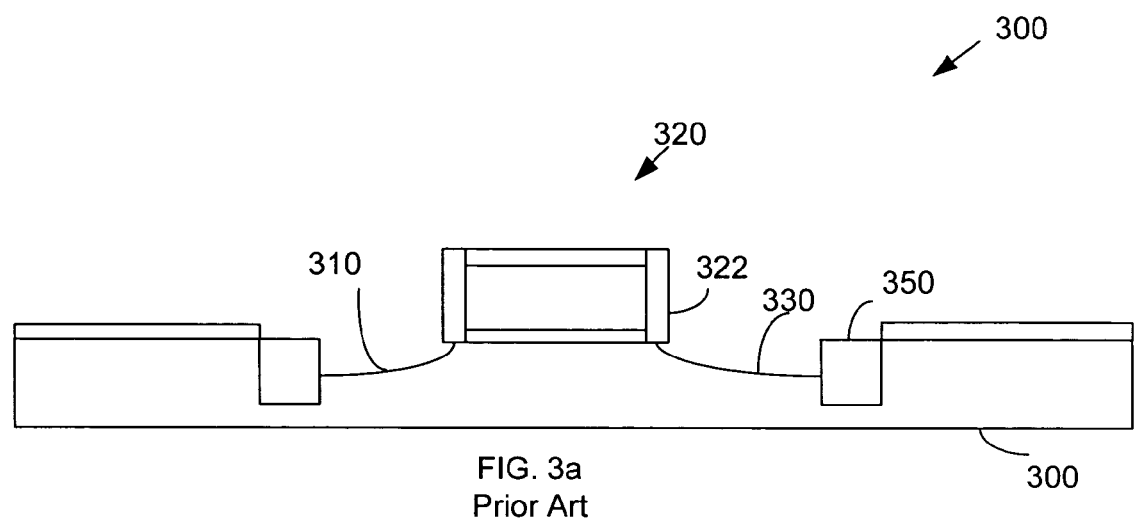
FIGS. 3a-3d represent structures from the Prior Art.
Figure 3B:
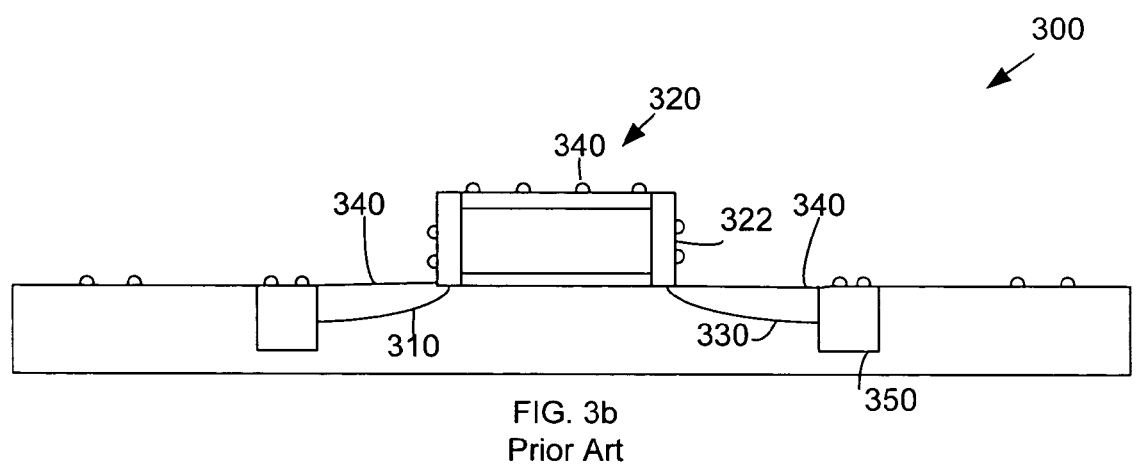
Figure 3C:
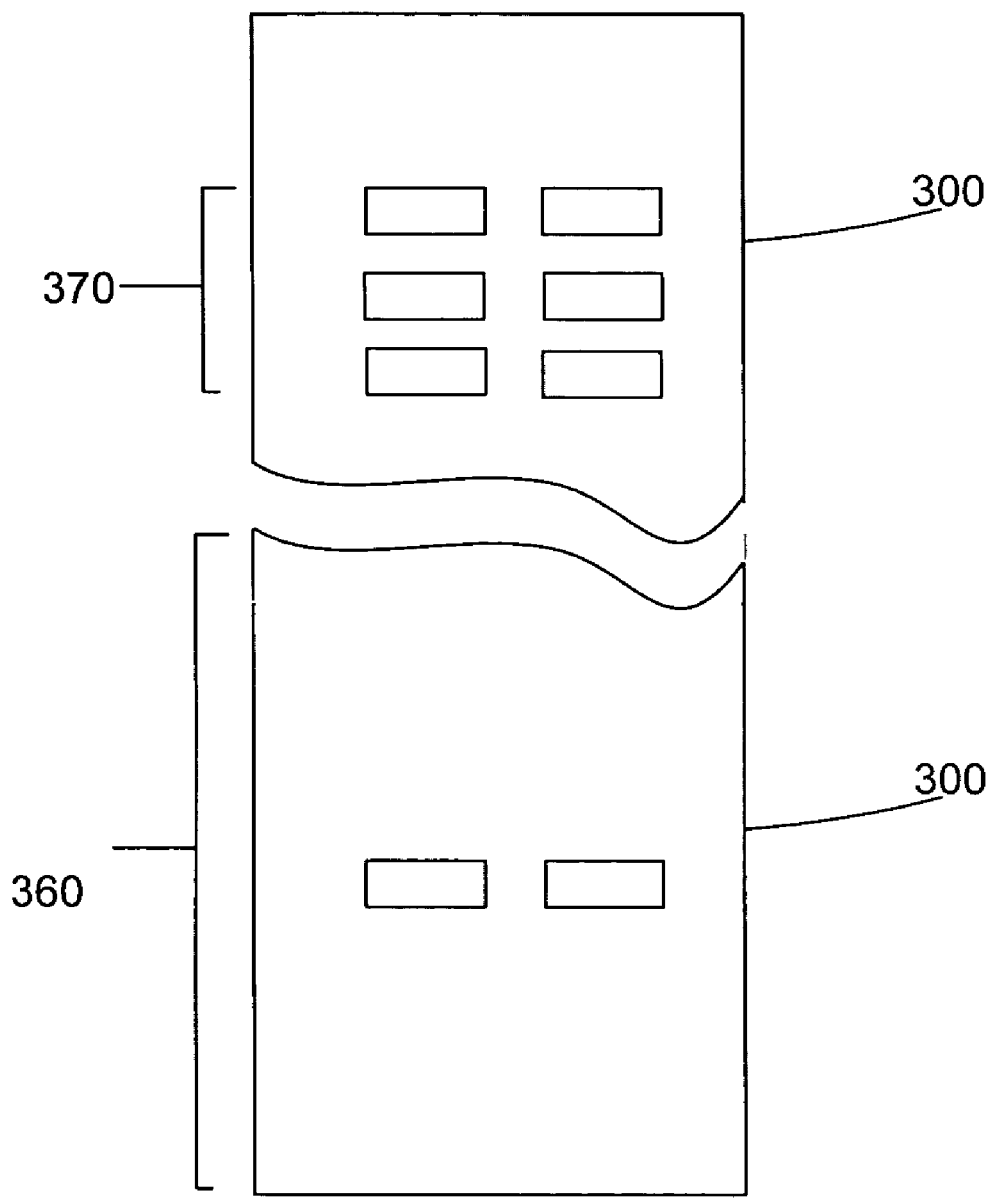
Figure 3D:
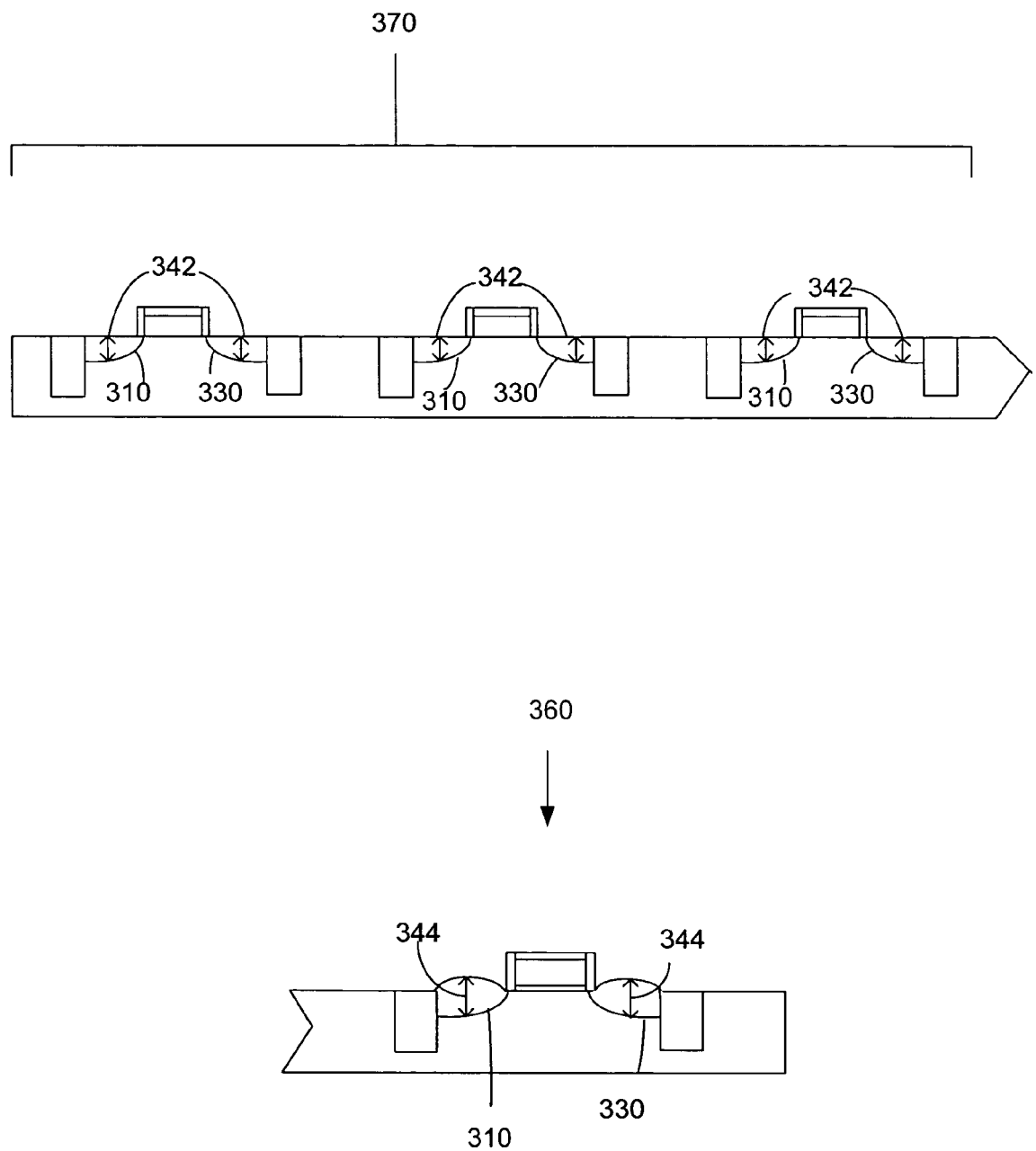

The silicon alloy layer 126 deposited according to the current embodiment of the present invention may comprise substantially 100% selectivity with respect to other areas located on the substrate 100, i.e. the silicon alloy layer 126 will not substantially deposit on undesirable areas of the substrate 100, such as on the masking layer 114, on a spacer structure 109, and on the isolation regions 112, for example as may be the case in prior art silicon alloy depositions (see FIG. 3b).

Thus, the method of the present invention greatly improves the selectivity of a silicon alloy layer 126 that may be utilized to form source and drain regions of a transistor structure. Providing a portion of non-active areas (i.e. dummy features, or dummy areas) to the region of lower active area density 113 so that the exposed silicon density in the region of lower active area density 113 substantially matches the exposed silicon density in the region of higher active area density 111 greatly improves the selectivity of a silicon alloy deposition process according to the methods of the present invention.

A microelectronic structure 128 may be formed according to the methods of the present invention, wherein the source region 106, the drain region 110 and the unmasked non-active areas 118 (i.e. the dummy areas) comprise the silicon alloy layer 126. The microelectronic structure 128 may then be further processed according to the design parameters of the particular application.

Figure 2A:
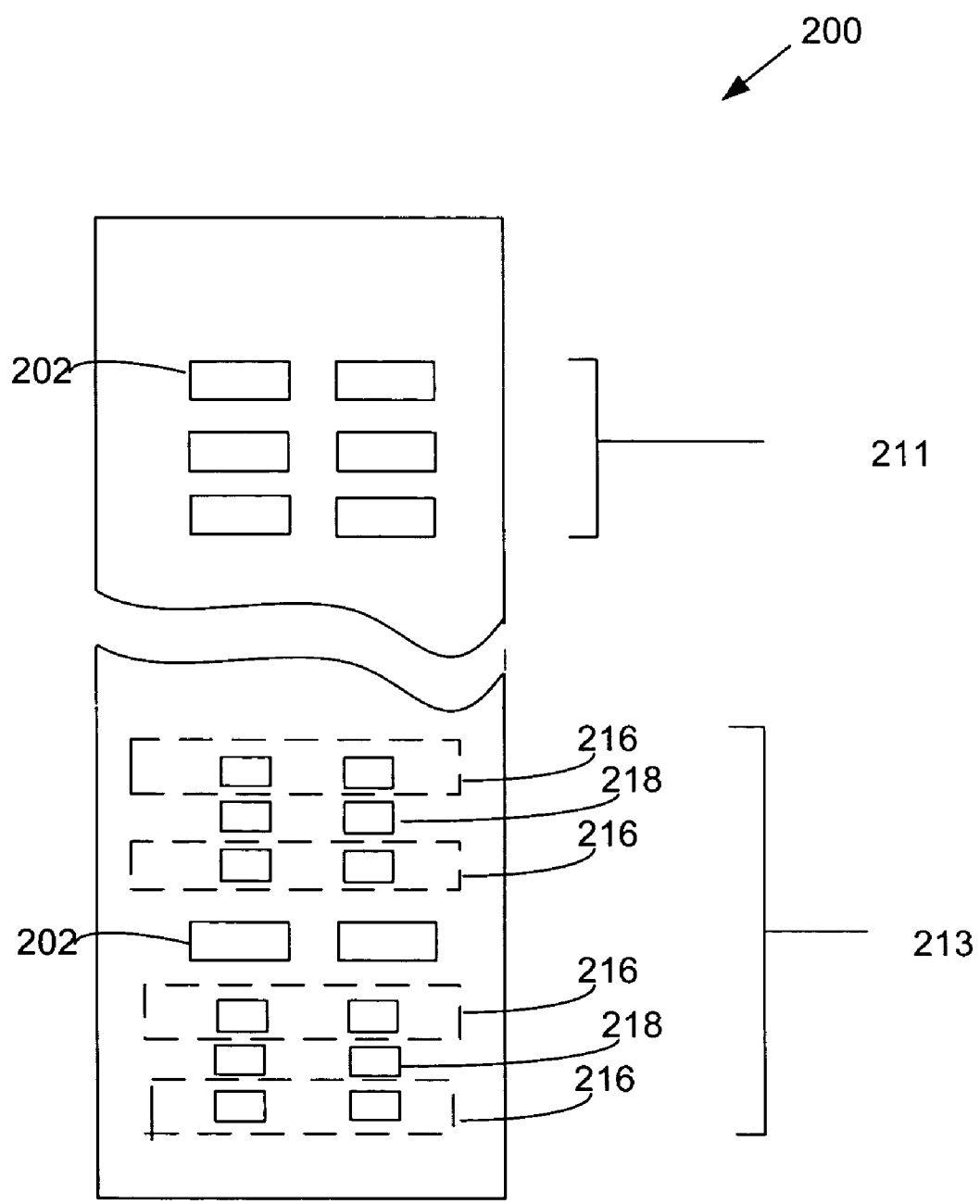
FIGS. 2a-2b represent structures according to an embodiment of the present invention.

The methods of the present invention may further improve the thickness uniformity across a substrate. Referring to FIG. 2a, a substrate 200, which may preferably comprise a silicon substrate (similar to the substrate 100 of FIG. 1a), may comprise a region of higher active area density 211 and a region of lower active area density 213, which may be located in different parts of the substrate 200. A portion of a plurality of non-active silicon areas 216 located in the region of the lower active area density 213 may be masked, leaving an unmasked portion of the plurality of non-active silicon areas 218 in the region of the lower active area density 213 that may add to the amount of exposed silicon in the region of the lower active area density 213, so that the amount of exposed silicon across the substrate 200 may be substantially uniform.

Figure 2B:
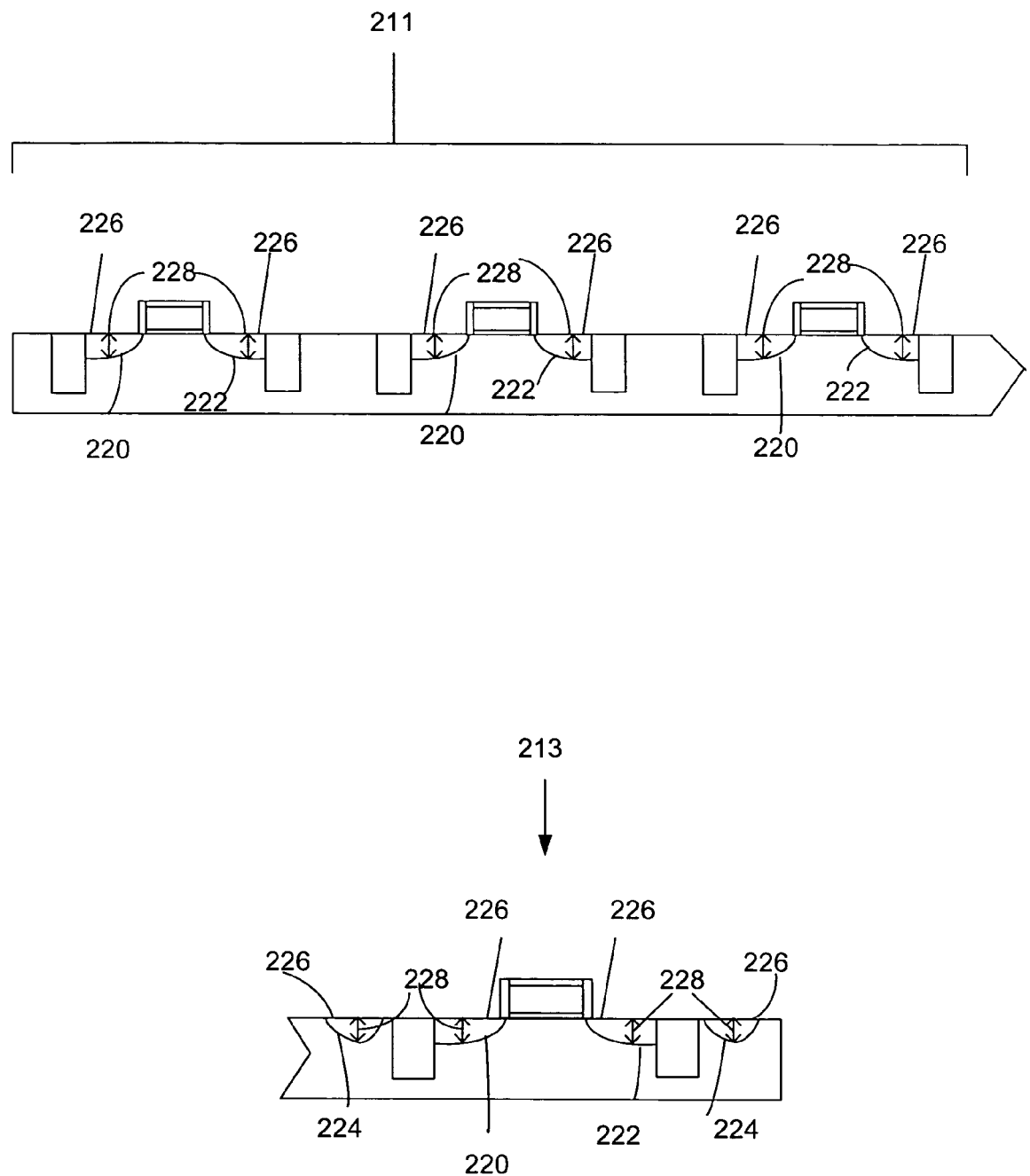

FIG. 2b depicts a cross section of the region of lower active area density 213 and the region of higher active area density 211, after a silicon alloy layer 226 (similar to the silicon alloy layer 126) has been deposited within a source recess 220, a drain recesses 222 and a non-active area recess 224 (similar to the source recess 120, drain recess 122 and non-active area recesses 124 of FIG. 1f). Because the density of exposed silicon in the region of the lower active area density 213 has been substantially matched to the to the region of higher active area density 211, the thickness 228 of the silicon alloy layer 226 is substantially similar in the region of lower active area density 202 and the region of higher active area density 204. The thickness uniformity across the substrate 200 may be about 20 percent or less.

Thus, the current embodiment of the present enables the use of selective deposition in the fabrication of microelectronic devices, such as when selectively depositing a silicon germanium alloy within source and drain regions of a transistor. The present invention greatly improves the deposition selectivity, and the thickness uniformity of such a deposition and therefore improves the manufacturability of such a deposition.

As described above, the present invention provides methods and associated structures of providing a substrate comprising a region of higher active area density comprising source and drain recesses and a region of lower active area density comprising source and drain recesses, wherein the region of lower active area density further comprises dummy recesses, and selectively depositing a silicon alloy layer in the source, to enhance the selectivity and uniformity of the silicon alloy deposition.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that a microelectronic device, such as a transistor is well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A structure comprising:
    a substrate comprising a region of higher active area density comprising silicon germanium alloy source and drain regions, and a region of lower active area density, wherein the region of lower active area density comprises dummy features comprising a silicon germanium alloy, and wherein the dummy features are not connected to polysilicon lines.

2. The structure of claim 1 wherein the thickness of the silicon alloy in the region of higher active area density is substantially the same as the thickness of the silicon alloy in the lower active areas density.

3. The structure of claim 2 wherein the thickness of the silicon alloy in the region of higher active area density is within about twenty percent or less of the thickness of the silicon alloy in the lower active areas.

4. The structure of claim 1 wherein the silicon germanium alloy comprises a p type dopant.

* * * * *